US010028054B2

(12) United States Patent
Furst et al.

(10) Patent No.: US 10,028,054 B2
(45) Date of Patent: Jul. 17, 2018

(54) APPARATUS AND METHOD FOR FREQUENCY DETECTION

(71) Applicant: Knowles Electronics LLC, Itasca, IL (US)

(72) Inventors: Claus Erdmann Furst, Roskilde (DK); Aziz Yurttas, Copenhagen (DK); Svetslav Gueorguiev, Copenhagen (DK); Anders Mortensen, Koge (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/512,846

(22) Filed: Oct. 13, 2014

(65) Prior Publication Data

US 2015/0110290 A1 Apr. 23, 2015

Related U.S. Application Data

(60) Provisional application No. 61/893,453, filed on Oct. 21, 2013.

(51) Int. Cl.
*H03G 5/00* (2006.01)
*H04R 3/04* (2006.01)
*H04R 1/04* (2006.01)

(52) U.S. Cl.
CPC ................. *H04R 3/04* (2013.01); *H04R 1/04* (2013.01); *H04R 2499/11* (2013.01)

(58) Field of Classification Search
CPC ......... H04R 3/04; H04R 1/04; H04R 2499/11
USPC .................................... 381/91, 98, 111, 122
See application file for complete search history.

(56) References Cited

U.S. PATENT DOCUMENTS

| | | | |
|---|---|---|---|
| 4,831,558 | A | 5/1989 | Shoup et al. |
| 5,555,287 | A | 9/1996 | Gulick et al. |
| 5,675,808 | A | 10/1997 | Gulick et al. |
| 5,822,598 | A | 10/1998 | Lam |
| 6,057,791 | A | 5/2000 | Knapp |
| 6,070,140 | A | 5/2000 | Tran |
| 6,154,721 | A | 11/2000 | Sonnic |
| 6,249,757 | B1 | 6/2001 | Cason |
| 6,259,291 | B1 | 7/2001 | Huang |
| 6,397,186 | B1 | 5/2002 | Bush et al. |
| 6,756,700 | B2 | 6/2004 | Zeng |
| 6,829,244 | B1 | 12/2004 | Wildfeuer et al. |

(Continued)

FOREIGN PATENT DOCUMENTS

| | | | |
|---|---|---|---|
| CN | 1083639 | A | 3/1994 |
| CN | 101288337 | A | 10/2008 |

(Continued)

OTHER PUBLICATIONS

International Search Report and Written Opinion for PCT/US2014/060426 dated Jan. 12, 2015 (9 pages).

(Continued)

*Primary Examiner* — William A Jerez Lora
(74) *Attorney, Agent, or Firm* — Foley & Lardner LLP

(57) ABSTRACT

An application specific integrated circuit (ASIC) is used with an acoustic device. An input clock signal is received. The frequency of the input clock signal is determined, and the frequency is indicative of one of a plurality of operational modes of the ASIC. Based upon the determined frequency, an amount current provided to one or more operational blocks of the ASIC is changed.

18 Claims, 3 Drawing Sheets

(56) References Cited

U.S. PATENT DOCUMENTS

| | | | | |
|---|---|---|---|---|
| 7,102,452 | B1 * | 9/2006 | Holmes | H03B 5/04 331/111 |
| 7,190,038 | B2 | 3/2007 | Dehe et al. | |
| 7,415,416 | B2 | 8/2008 | Rees | |
| 7,473,572 | B2 | 1/2009 | Dehe et al. | |
| 7,546,498 | B1 * | 6/2009 | Tang | G06F 21/76 713/182 |
| 7,619,551 | B1 | 11/2009 | Wu | |
| 7,630,504 | B2 | 12/2009 | Poulsen | |
| 7,774,204 | B2 | 8/2010 | Mozer et al. | |
| 7,781,249 | B2 | 8/2010 | Laming et al. | |
| 7,795,695 | B2 | 9/2010 | Weigold et al. | |
| 7,825,484 | B2 | 11/2010 | Martin et al. | |
| 7,829,961 | B2 | 11/2010 | Hsiao | |
| 7,856,283 | B2 | 12/2010 | Burk et al. | |
| 7,856,804 | B2 | 12/2010 | Laming et al. | |
| 7,903,831 | B2 | 3/2011 | Song | |
| 7,957,972 | B2 | 6/2011 | Huang et al. | |
| 8,274,856 | B2 * | 9/2012 | Byeon | G11O 5/147 323/313 |
| 8,275,148 | B2 | 9/2012 | Li et al. | |
| 8,666,751 | B2 | 3/2014 | Murthi et al. | |
| 8,798,289 | B1 | 8/2014 | Every et al. | |
| 8,849,231 | B1 | 9/2014 | Murgia et al. | |
| 8,972,252 | B2 | 3/2015 | Hung et al. | |
| 8,996,381 | B2 | 3/2015 | Mozer et al. | |
| 9,043,211 | B2 | 5/2015 | Haiut et al. | |
| 9,111,548 | B2 | 8/2015 | Nandy et al. | |
| 9,112,984 | B2 | 8/2015 | Sejnoha et al. | |
| 9,113,263 | B2 | 8/2015 | Furst et al. | |
| 9,119,150 | B1 | 8/2015 | Murgia et al. | |
| 2003/0138061 | A1 | 7/2003 | Li | |
| 2003/0171907 | A1 | 9/2003 | Gal-On et al. | |
| 2005/0207605 | A1 | 9/2005 | Dehe et al. | |
| 2006/0013415 | A1 | 1/2006 | Winchester | |
| 2006/0074658 | A1 | 4/2006 | Chadha | |
| 2006/0164151 | A1 * | 7/2006 | Chatterjee | G05F 3/242 327/512 |
| 2007/0127761 | A1 | 6/2007 | Poulsen | |
| 2007/0274297 | A1 | 11/2007 | Cross et al. | |
| 2007/0278501 | A1 | 12/2007 | MacPherson et al. | |
| 2008/0175425 | A1 | 7/2008 | Roberts et al. | |
| 2008/0267431 | A1 | 10/2008 | Leidl et al. | |
| 2008/0279407 | A1 | 11/2008 | Pahl | |
| 2008/0283942 | A1 | 11/2008 | Huang et al. | |
| 2009/0001553 | A1 | 1/2009 | Pahl et al. | |
| 2009/0003629 | A1 | 1/2009 | Shajaan et al. | |
| 2009/0180655 | A1 | 7/2009 | Tien et al. | |
| 2009/0234645 | A1 | 9/2009 | Bruhn | |
| 2009/0257289 | A1 * | 10/2009 | Byeon | G11O 5/147 365/189.09 |
| 2009/0316935 | A1 | 12/2009 | Furst et al. | |
| 2010/0046780 | A1 | 2/2010 | Song | |
| 2010/0052082 | A1 | 3/2010 | Lee et al. | |
| 2010/0128914 | A1 | 5/2010 | Khenkin | |
| 2010/0183181 | A1 | 7/2010 | Wang | |
| 2010/0246877 | A1 | 9/2010 | Wang et al. | |
| 2010/0290644 | A1 | 11/2010 | Wu et al. | |
| 2010/0322443 | A1 | 12/2010 | Wu et al. | |
| 2010/0322451 | A1 | 12/2010 | Wu et al. | |
| 2011/0013787 | A1 | 1/2011 | Chang | |
| 2011/0075875 | A1 | 3/2011 | Wu et al. | |
| 2011/0107010 | A1 * | 5/2011 | Strauss | G11C 16/10 711/103 |
| 2011/0170714 | A1 * | 7/2011 | Hanzlik | H02M 3/07 381/111 |
| 2011/0293115 | A1 * | 12/2011 | Henriksen | H03F 1/301 381/111 |
| 2012/0043974 | A1 | 2/2012 | Van Den Boom et al. | |
| 2012/0112804 | A1 | 5/2012 | Li et al. | |
| 2012/0113899 | A1 | 5/2012 | Overmars | |
| 2012/0177227 | A1 * | 7/2012 | Adachi | H03G 1/0088 381/107 |
| 2012/0232896 | A1 | 9/2012 | Taleb et al. | |
| 2012/0250910 | A1 * | 10/2012 | Shajaan | H04R 1/005 381/174 |
| 2012/0310641 | A1 | 12/2012 | Niemisto et al. | |
| 2013/0035777 | A1 | 2/2013 | Niemisto et al. | |
| 2013/0044898 | A1 | 2/2013 | Schultz et al. | |
| 2013/0058495 | A1 | 3/2013 | Furst et al. | |
| 2013/0195291 | A1 | 8/2013 | Josefsson | |
| 2013/0223635 | A1 | 8/2013 | Singer et al. | |
| 2013/0322461 | A1 | 12/2013 | Poulsen | |
| 2014/0163978 | A1 | 6/2014 | Basye et al. | |
| 2014/0244269 | A1 | 8/2014 | Tokutake | |
| 2014/0244273 | A1 | 8/2014 | Laroche et al. | |
| 2014/0257821 | A1 | 9/2014 | Adams et al. | |
| 2014/0270260 | A1 | 9/2014 | Goertz et al. | |
| 2014/0274203 | A1 | 9/2014 | Ganong et al. | |
| 2014/0278435 | A1 | 9/2014 | Ganong et al. | |
| 2014/0281628 | A1 | 9/2014 | Nigam et al. | |
| 2014/0343949 | A1 | 11/2014 | Huang et al. | |
| 2014/0348345 | A1 | 11/2014 | Furst et al. | |
| 2015/0055803 | A1 | 2/2015 | Qutub et al. | |
| 2015/0106085 | A1 | 4/2015 | Lindahl | |
| 2015/0112690 | A1 | 4/2015 | Guha et al. | |
| 2015/0134331 | A1 | 5/2015 | Millet et al. | |

FOREIGN PATENT DOCUMENTS

| | | | |
|---|---|---|---|
| CN | 102224675 | A | 10/2011 |
| JP | 2002330488 | A | 11/2002 |
| WO | WO-02/03747 | A2 | 1/2002 |
| WO | WO-2005/009072 | A2 | 1/2005 |
| WO | WO-2007/009465 | A2 | 1/2007 |
| WO | WO-2010/060892 | A1 | 6/2010 |

OTHER PUBLICATIONS

International Preliminary Report on Patentability, PCT/US2014/060426, Knowles Electronics, LLC, 6 pages (May 6, 2016).

* cited by examiner

APPARATUS AND METHOD FOR FREQUENCY DETECTION

CROSS REFERENCE TO RELATED APPLICATION

This patent claims benefit under 35 U.S.C. § 119 (e) to U.S. Provisional Application No. 61/893,453 entitled "Apparatus And Method For Frequency Detection" filed Oct. 21, 2013, the content of which is incorporated herein by reference in its entirety.

TECHNICAL FIELD

This application relates to microphones and, more specifically, to the operation of these microphones.

BACKGROUND OF THE INVENTION

Microphones are typically composed of two main components: a Micro-Electro-Mechanical System (MEMS) device that receives and converts sound energy into an electrical signal, and Application Specific Integrated Circuit (ASIC) (or other circuit) that takes the electrical signal from the MEMS device and performs post-processing on the signal and/or buffering the signal for the following circuit stages in a larger electronic environment.

The output of the ASIC can be in analog form or in digital form, and the microphones with ASIC providing digital output are generally referred to as digital microphones. In recent years, digital microphones have become increasingly popular in portable electronic equipment and, in particular, within mobile phones.

Compared to analog microphones, digital microphones offer additional functionalities and offer better control of microphone's operation. For example and in many electronic systems where digital microphones are used, multimode operation of the electronic system is desired. Multimode operation refers to operating modes where the electronic system can work with full performance with higher current consumption, lower performance with lower current consumption, and standby mode with no performance for very low power consumption. Such multimode operation requires that the microphone is capable of supporting such operational modes.

Unfortunately, previous approaches have not adequately addressed these concerns. This has led to some user dissatisfaction with these previous approaches.

BRIEF DESCRIPTION OF THE DRAWINGS

For a more complete understanding of the disclosure, reference should be made to the following detailed description and accompanying drawings wherein.

Figure 1:
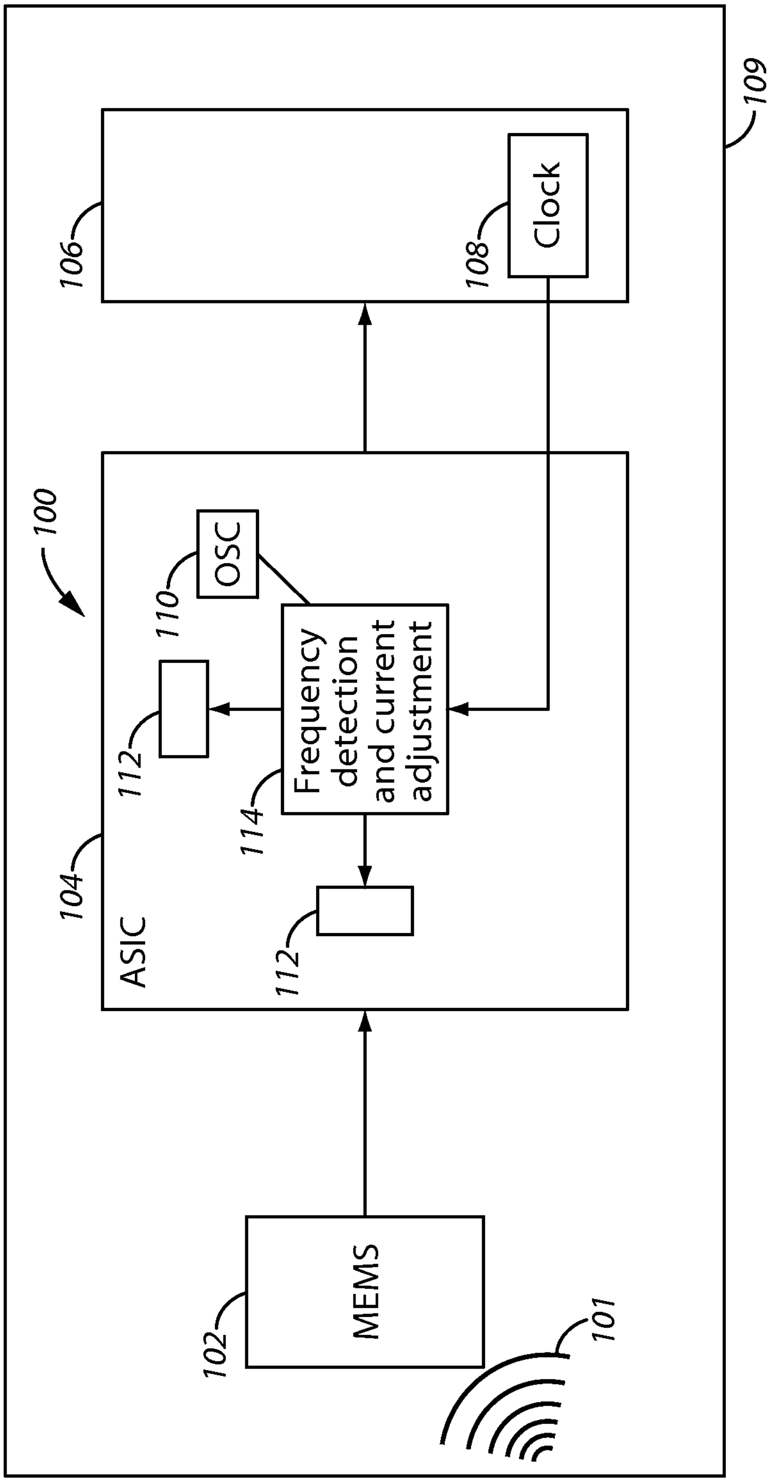
FIG. 1 comprises a block diagram of a system that uses frequency detection in a microphone according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided that implement a multimode microphone, where the microphone works in multiple modes and, at the same time, current consumption (and power usage) of the microphone follows the frequency of the input clock.

In many of these embodiments, the frequency of the input clock is compared to an internally generated clock signal. The frequency of the input clock is indicative of the operational mode of an application specific integrated circuit (ASIC) or other device. The comparison allows for accurate detection of the input frequency. The current provided to different operational blocks of the ASIC can be changed based upon the frequency (which now has been measured accurately). In other words, the current (or power) consumption of the ASIC (or portions of the ASIC) follows the frequency change of the input clock. Additional, different operation modes dependent on the frequency of the input clock are followed and their specific current and power needs are addressed because of the flexibility of changing the current according to these approaches.

In other aspects, the internal oscillator signal (from the ASIC) is temperature compensated for its frequency. In still other aspects and to reduce the design complexity, the internal oscillator signal (from the ASIC) is not process compensated for frequency, but rather the process compensation is performed during manufacturing test of the ASIC, where trim test for process compensation is done and then the trim value is stored to One Time Programmable (OTP) memory.

The current consumption values for a given operational mode or frequency is determined by the requirements on noise and current consumption. In these regards, noise is also a parameter that is considered and controlled, as there is a well known relation between noise and current consumption in analog mixed-mode integrated circuit (IC) design.

In many of these embodiments, an application specific integrated circuit (ASIC) is coupled to an acoustic device. The ASIC includes at least one operational block and a frequency detection block. The frequency detection block is configured to receive an input clock signal, determine the frequency of the input clock signal, the frequency indicative of one of a plurality of operational modes of the ASIC. The frequency detection block is further configured to based upon the determined frequency, change an amount current provided to the at least one operational block.

In other aspects, the frequency detection block compares the input clock to an internally generated clock signal that runs independently of temperature and process. In other examples, the acoustic device is a micro-electro-mechanical system (MEMS) microphone.

In some examples, each of the plurality of modes has a different discrete current consumption. In other examples, the modes may be a stand-by mode, a low power mode, a standard performance mode, or a high performance mode. Other examples are possible.

In others of these embodiments, an application specific integrated circuit (ASIC) is used with an acoustic device. An input clock signal is received. The frequency of the input clock signal is determined, and the frequency is indicative of one of a plurality of operational modes of the ASIC. Based upon the determined frequency, an amount current provided to one or more operational blocks of the ASIC is changed or adjusted.

Referring now to FIG. 1, one example of a microphone assembly 100 is described. The microphone assembly includes a MEMS device 102, and an application specific integrated circuit (ASIC) 104. The assembly 100 couples to circuitry 106 that is part of a device 109. The device 109 may be a cellular phone, personal computer, or any other device that uses microphones. The circuitry 106 is any type of electronic circuitry that performs any type of processing function. The circuitry 106 may be divided into functional modules as appropriate and may be any combination of hardware and software elements (e.g., it may include microprocessors that execute programmed instructions). The circuitry 106 includes a clock 108 that is coupled to the ASIC 104.

The MEMS device 102 is any type of MEMS microphone device that converts sound energy 101 into an analog electrical signal (that is transmitted to the ASIC 104). The ASIC 104 may be any type of integrated circuit that performs various types of functions such as buffering or amplification, to mention two example functions. The ASIC 104 operates in various modes of operation and each of these modes of operations utilizes or requires different power levels. If the power level is incorrect, the ASIC 104 will either not operate or not operate properly. The ASIC 104 processes the signal received from the MEMS device 102 for use by the circuitry 106.

In order that the ASIC operate properly for a certain mode of ASIC operation, a frequency detection block 114 is configured to provide current adjustment based upon the received input frequency from the clock 108. In these regards, the frequency of the clock 108 represents the mode of operation of the ASIC 104. The frequency of the input clock 108 is compared by block 114 to an internally generated clock signal from an internal oscillator 110 on the ASIC 104. The frequency of the input clock 108 is indicative of the operational mode of the ASIC 104. The comparison by block 114 allows for accurate detection of the input frequency of the clock 108. The current provided to different operational blocks 112 of the ASIC can be changed by block 114 based upon this detected frequency (which now has been measured accurately). In other words, the current consumption of the ASIC 104 (or portions of the ASIC 104) follows the frequency change of the input clock 108. Additional and/or different operation modes dependent on the frequency of the input clock 108 are followed and their specific current and power needs are addressed because of the flexibility of changing the current.

The frequency detection aspects of the ASIC 104 (and particular the operation of block 114) are described in further detail below with respect to FIG. 2 and FIG. 3.

Figure 2:
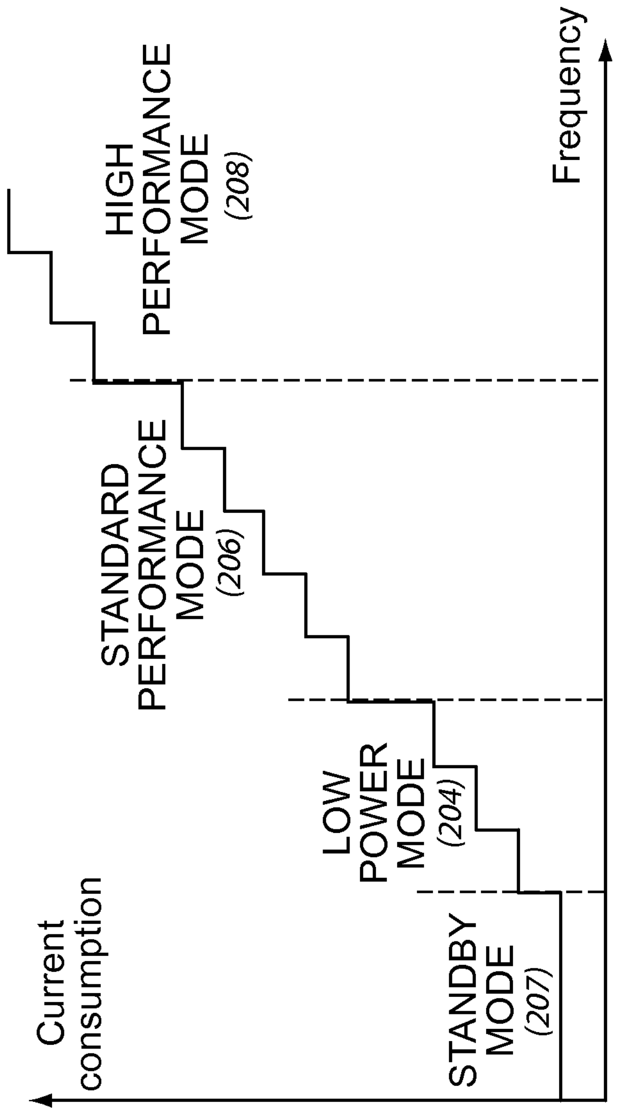
FIG. 2 comprises a chart showing one example of the operation of the frequency detection approaches described herein according to various embodiments of the present invention.

Referring now to FIG. 2, the operation of the microphone is divided into four modes 202, 204, 206, and 208. It will be understood that fewer or additional numbers of modes can be defined based on the needed requirements from ASIC including current consumption and noise. These modes have different discrete levels of current consumption (shown on the vertical axis) and these current levels are adjusted according to the present approaches. It can be seen that these levels or stepped, rather than following a linear sloped pattern.

The standby mode 202 is where the current consumption is at a minimum, but the microphone is not functional. The low power mode 204 is where the current consumption is kept at a minimum but the microphone is functional with reduced performance. The standard performance mode 206 is where the current consumption is higher compared to the low power mode 204 and at the same time performance of the microphone is increased. The high performance mode 208 is where both the current consumption and the performance are at maximum.

In each mode, the current consumption is further increased (or decreased) and follows the detected frequency. For instance, several clock driven circuits by nature require higher current consumption for higher clock frequency for a given performance or require higher current consumption for better noise performance. Examples of circuits needing varying power levels include analog-to-digital (A-to-D) converters and switch-capacitor filters, both of which are commonly used in digital microphones. Other examples are possible.

Figure 3:
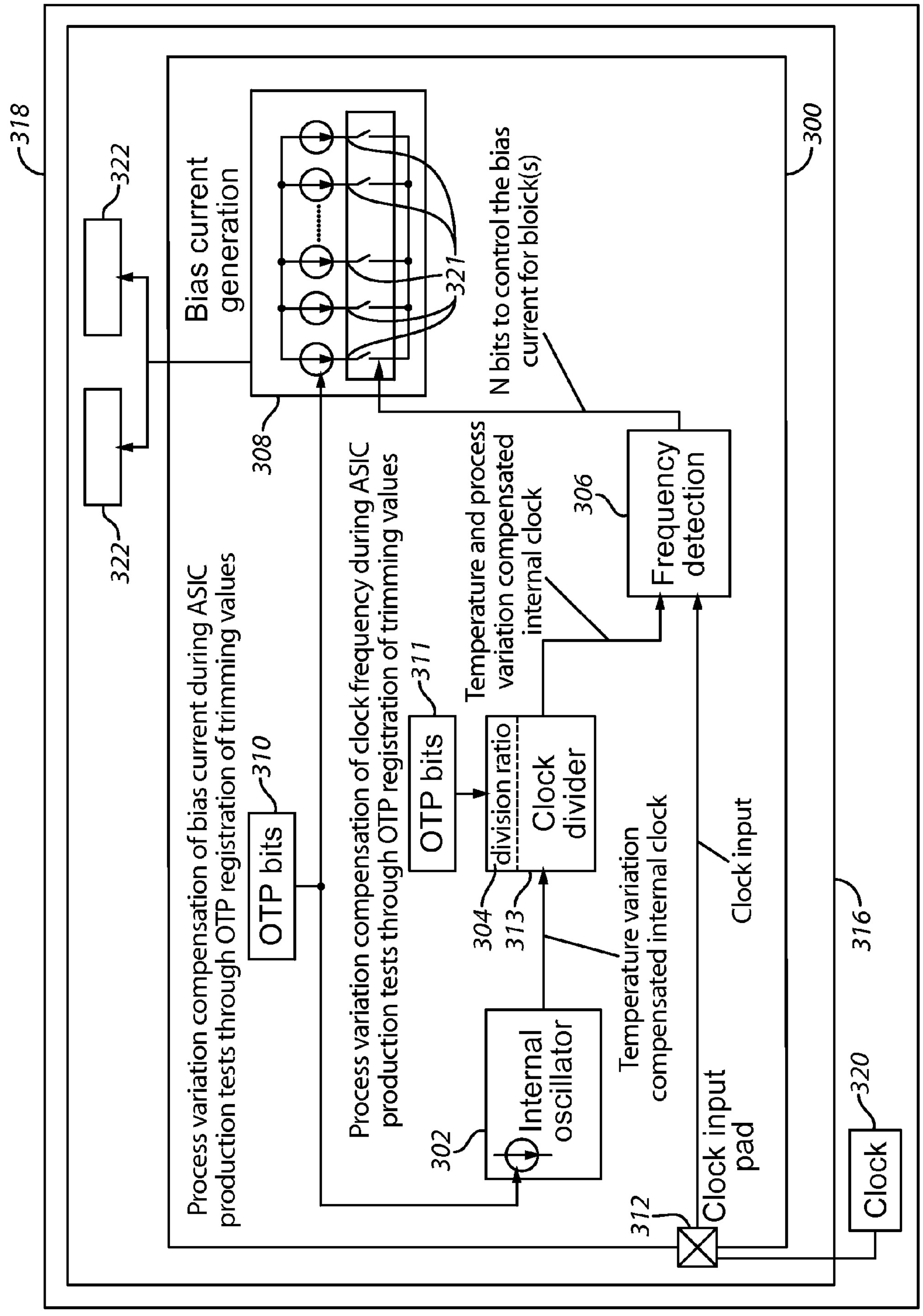
FIG. 3 comprises a block diagram of an application specific integrated circuit (ASIC) with frequency detect according to various embodiments of the present invention.

Referring now to FIG. 3, one example of a frequency detect and current adjustment block 300 (e.g., block 114 of FIG. 1) are described. In these regards, FIG. 3 illustrates one possible implementation about how to make bias current following the frequency of input clock independent of process, and temperature variations. Other examples are possible. The block 300 includes an internal oscillator 302, a clock divider 304, a frequency detection device 306, a bias current generator 308, one-time programmable (OTP) memory bits 310 and 311, and a clock input pad 312 (that couples to the frequency detection device 306). The block 300 may be disposed on an ASIC 316. The ASIC 316 may be disposed in a device 318 that includes a clock 320, which is coupled to the clock input pad 312. The device 318 may be a cellular phone or personal computer to mention two examples.

In operation, the internal oscillator 302 outputs a signal received by the clock divider 304. The OTP bits 310 may be used to compensate for process variations during the manufacturing process. For example, the oscillator frequency may be measured, compared to what is desired, and the bits applied to make the oscillator operate at the desired frequency. The output of the oscillator 302 is a temperature compensated clock signal. OTP bits 311 are applied to the clock divider 304 in the form of a division ratio 313 to compensate for various tolerances amongst oscillators/ASICs. This may occur during manufacturing where the division ratio is changed based upon the particular oscillators/ASIC. The output of the divider 304 is a temperature and process compensated clock signal. In other words, the output of the divider 304 can be considered an accurate clock since both temperature and process have been considered and compensation was made to the clock signal based upon these factors.

The frequency detection device 306 compares the input clock (from the device 318) to the accurate clock to find out the frequency of the input clock. It sends an n-bit control signal to the bias current generator 308. The bias current generator 308 may also be adjusted by the OTP bits during manufacturing to compensate for process variations. The n-bits are a digital bit representation of the input clock frequency. For example, if the digital representation is 1, frequency may be 100 Khz, if it is 2, frequency may be between 100 kHz and 200 kHz, and so forth. This n-bit signal activates various ones of the switches 321 within the generator 308. The more switches 312 that are closed, the more current that is supplied. In this way, the current is adjusted based upon the frequency (which represents mode) of the clock 320. The current from 308 may flow to different blocks 322 of the ASIC 316, thereby operating the ASIC 316 as needed. As can be seen in FIG. 2, the approaches utilized in FIG. 3 result in a stepped current response, rather than a linear progression.

Accordingly, the present approaches provide digital microphone that operate in multiple modes with different performance aspects including current consumption and noise. Changes in performance aspects are controlled through the change in the clock input frequency. Detection of change in the clock input frequency is done by comparing the clock input to an internally generated accurate clock source from an oscillator on the ASIC. The internally generated clock signals (on the ASIC) run independently of both temperature and process. Temperature independency can be achieved by using process independent current source in the oscillator. Process independency can be achieved by using OTP registration of process variation compensation during ASIC production tests.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A microphone assembly comprising:

an electro-acoustic transducer;

an integrated circuit (IC) coupled to the electro-acoustic transducer, the IC comprising:

an oscillator configured to generate an internal clock signal;

at least one operational block; and a frequency detection block configured to:

receive, from a device external to the microphone assembly, an external clock signal; and determine a frequency of the external clock signal, the frequency indicative of one of a plurality of operational modes of the IC;

the microphone assembly configured to operate in a first mode of operation based on a first frequency of the external clock signal, and the microphone assembly configured to operate in a second mode of operation based on a second frequency of the external clock signal.

2. The microphone assembly of claim 1, wherein the frequency detection block is configured to compare the external clock signal to the internal clock signal to determine the frequency of the external clock signal.

3. The microphone assembly of claim 1, wherein the electro-acoustic transducer is a micro-electro-mechanical system (MEMS) microphone.

4. The microphone assembly of claim 1 further comprising a bias current generator configured to determine an amount of current provided to the at least one operational block based upon the frequency of the external clock signal, wherein each mode of operation has a different current consumption.

5. The microphone assembly of claim 1, wherein the first and second modes of operation are selected from a group consisting of a stand-by mode, a low power mode, a standard performance mode, and a high performance mode.

6. A method of operating a microphone assembly that comprises an electro-acoustic transducer and an integrated circuit (IC) having an oscillator configured to generate an internal clock signal, the method comprising:

receiving, from a device external to the microphone assembly, an external clock signal;

determining a frequency of the external clock signal, the frequency indicative of one of a plurality of operational modes of the IC;

based upon the determined frequency, determining an amount of current provided to one or more operational blocks of the IC; and operating the microphone assembly in one of the plurality of operational modes based on the frequency of the external clock signal by applying the determined amount of current to the one or more operational blocks.

7. The method of claim 6, determining the frequency of the external clock signal comprises by comparing the external clock signal to the internal clock signal.

8. The method of claim 6, wherein each of the plurality of operational modes has a different discrete current consumption.

9. The method of claim 6, wherein the operational modes are selected from the group consisting of a stand-by mode, a low power mode, a standard performance mode, and a high performance mode.

10. The microphone assembly of claim 1, further comprising a bias current generator configured to adjust the amount of current to compensate for process variation using trimming values stored on the microphone assembly.

11. The microphone assembly of claim 10, wherein first trimming values are stored in a programmable memory as part of manufacturing.

12. The microphone assembly of claim 11, wherein the programmable memory is a one-time programmable (OTP) memory.

13. The microphone assembly of claim 2, further comprising:

a clock divider configured to apply a division ratio to the internal clock signal before determining the frequency of the external clock signal.

14. The microphone assembly of claim 13, further comprising trimming values stored in a programmable memory of the IC, wherein the division ratio is adjusted based on the trimming values to compensate the clock signal for temperature and process variables.

15. The microphone assembly of claim 1, wherein the modes are selected from the group consisting of a low power mode and a standard performance mode.

16. The method of claim 7, further comprising:

compensating for temperature and process variables by adjusting the internal-clock signal using trimming values stored on the microphone assembly before determining the frequency of the external clock signal.

17. The method of claim 16, further comprising storing the trimming values in an OTP memory.

18. The microphone assembly of claim 4, wherein the bias current generator is further configured to:

receive a control signal from the frequency detection block; and activate one or more switches to change the amount of current provided to the at least one operational block.

* * * * *